(12) United States Patent
Hansen

(10) Patent No.: US 11,043,337 B2
(45) Date of Patent: Jun. 22, 2021

(54) METER INCLUDING A SUPERCAPACITOR

(71) Applicant: AVX Corporation, Fountain Inn, SC (US)

(72) Inventor: Shawn Hansen, Simpsonville, SC (US)

(73) Assignee: AVX Corporation, Fountain Inn, SC (US)

( * ) Notice: Subject to any disclaimer, the term of this patent is extended or adjusted under 35 U.S.C. 154(b) by 150 days.

(21) Appl. No.: 16/275,589

(22) Filed: Feb. 14, 2019

(65) Prior Publication Data

US 2019/0259548 A1    Aug. 22, 2019

Related U.S. Application Data

(60) Provisional application No. 62/633,821, filed on Feb. 22, 2018.

(51) Int. Cl.
| | | |
|---|---|---|
| *G01R 11/04* | (2006.01) | |
| *H01G 11/68* | (2013.01) | |
| *H01G 11/32* | (2013.01) | |
| *G01R 22/06* | (2006.01) | |
| *H01G 11/10* | (2013.01) | |
| *G01F 15/00* | (2006.01) | |

(52) U.S. Cl.
CPC .......... *H01G 11/68* (2013.01); *G01R 22/061* (2013.01); *G01R 22/063* (2013.01); *H01G 11/10* (2013.01); *H01G 11/32* (2013.01); *G01F 15/00* (2013.01)

(58) Field of Classification Search
CPC ............................. G01R 22/061; G01R 22/063
See application file for complete search history.

(56) References Cited

U.S. PATENT DOCUMENTS

| | | | |
|---|---|---|---|
| 4,763,227 A | 8/1988 | Novacek | |
| 5,093,762 A | 3/1992 | Sato et al. | |
| 6,413,283 B1 | 7/2002 | Day et al. | |
| 6,665,620 B1 * | 12/2003 | Burns .............. | G01R 19/16547 |
| | | | 702/62 |
| 7,342,768 B2 | 3/2008 | Doljack et al. | |
| 7,483,259 B2 | 1/2009 | Biler | |
| 7,580,245 B2 | 8/2009 | Inoue et al. | |
| 7,813,105 B2 | 10/2010 | Cheung | |
| 7,859,844 B2 | 12/2010 | Nguyen et al. | |

(Continued)

FOREIGN PATENT DOCUMENTS

| | | |
|---|---|---|
| CN | 204230059 U | 3/2015 |
| JP | H 01230218 A | 9/1989 |

(Continued)

OTHER PUBLICATIONS

Information from VINATech—Sealed Supercapacitors are Suitable for Intrinsically Safe Applications, Aug. 16, 2015, 2 pages.

(Continued)

*Primary Examiner* — Thang X Le
(74) *Attorney, Agent, or Firm* — Dority & Manning, P.A.

(57) ABSTRACT

A meter for measuring a flow of a product is disclosed. The meter includes a sensor configured to sense the flow of the product and a microcomputer communicatively coupled with the sensor and configured to measure the flow of the product based on signals received from the sensor. The meter also includes at least one supercapacitor electrically coupled with the microcomputer and configured to supply power to the microcomputer.

18 Claims, 3 Drawing Sheets

(56) References Cited

U.S. PATENT DOCUMENTS

| | | | |
|---|---|---|---|
| 8,116,044 B2 | 2/2012 | Pelc et al. | |
| 8,194,393 B2 | 6/2012 | Inoue et al. | |
| 8,345,406 B2* | 1/2013 | Dreissig | H01G 11/04 |
| | | | 361/504 |
| 8,358,109 B2 | 1/2013 | Gunderson | |
| 8,723,506 B2 | 5/2014 | Ramirez | |
| 8,829,350 B2 | 9/2014 | Iwasaki et al. | |
| 8,932,750 B2 | 1/2015 | Cooley et al. | |
| 9,728,342 B2 | 8/2017 | Bendale et al. | |
| 10,312,028 B2 | 6/2019 | Rawal et al. | |
| 2004/0061624 A1* | 4/2004 | Villicana | H04Q 9/00 |
| | | | 340/870.02 |
| 2006/0103368 A1* | 5/2006 | Rowe | G01R 22/10 |
| | | | 324/107 |
| 2010/0265660 A1* | 10/2010 | Nguyen | H01G 2/08 |
| | | | 361/696 |
| 2013/0021021 A1* | 1/2013 | Ramirez | G01R 22/061 |
| | | | 324/142 |
| 2015/0002987 A1* | 1/2015 | Signorelli | H01G 11/18 |
| | | | 361/502 |
| 2017/0207489 A1* | 7/2017 | Zhamu | H01M 10/0585 |
| 2017/0338055 A1 | 11/2017 | Knopsnyder et al. | |
| 2018/0238725 A1* | 8/2018 | Black | G01N 29/46 |
| 2018/0287657 A1* | 10/2018 | Rose | H04B 1/1036 |
| 2019/0259549 A1 | 8/2019 | Hansen | |
| 2019/0259550 A1 | 8/2019 | Hansen | |
| 2019/0281371 A1* | 9/2019 | Klicpera | H04L 12/2827 |
| 2019/0304711 A1 | 10/2019 | Hansen | |

FOREIGN PATENT DOCUMENTS

| | | |
|---|---|---|
| JP | H 06176972 A | 6/1994 |
| JP | H09129473 A | 5/1997 |
| JP | 201400 3193 A | 1/2014 |
| KR | 101521802 B | 5/2015 |

OTHER PUBLICATIONS

Product Information from VINATech regarding Hy-Cap 2-Series Module, 2015, 2 pages.

Information from VINATech—High Density Moulded Supercapacitor Module Targets Intrinsically Safe Applications, Aug. 19, 2015, 1 page.

Product Information—New 7.5V SCM Series Supercapacitor Modules from AVX Corporation, 100317, 8 pages.

Product Information—SCC LE Series SuperCapacitors from AVX Corporation, 101217, 8 pages.

Product Information—BestCap® Ultra-low ESR High Power Pulse Supercapacitors, 27 pages.

* cited by examiner

METER INCLUDING A SUPERCAPACITOR

CROSS REFERENCE TO RELATED APPLICATION

The present application claims filing benefit of U.S. Provisional Patent Application Ser. No. 62/633,821 having a filing date of Feb. 22, 2018, which is incorporated herein by reference in its entirety.

BACKGROUND OF THE INVENTION

Utility providers generally supply a product (e.g., water, gas, power, etc.) over a distribution network to consumers of the product. For example, a power distribution network, such as an electrical distribution grid, generally delivers electrical power from power suppliers to power consumers (e.g., residential and commercial buildings). Power providers typically generate electrical power using power generation plants and supply the generated electrical power into the distribution grid. The power then flows from the power grid to the consumers.

Meters are generally used to monitor the consumption of each consumer such that the provider can appropriately bill each consumer. Recently, "smart" meters have provided additional connectivity and monitoring of such consumption. For example, smart power meters allow the power provider to monitor power consumption (e.g., over the Internet). Additionally, such smart power meters allow consumers to monitor their own power usage, which allows them to target and eliminate wasted consumption.

Power irregularities and/or outages, however, can interfere with or interrupt the operation of meters, such as power meters. Additionally, some meters, such as water or gas meters, may not have an external power supply (e.g., connection to the electrical grid). While batteries have been used to provide power and/or backup power for such meters, batteries are not well suited to supply short, intense surges of power, when needed. For example, such surges may be needed to transmit consumption data. Moreover relying on batteries for such power surge demands can reduce the life of the battery. Accordingly, a meter having an improved power supply system would be welcomed in the art.

SUMMARY

In accordance with one embodiment of the present disclosure, a meter for measuring a flow of a product includes a sensor configured to sense the flow of the product. The meter includes a microcomputer communicatively coupled with the sensor and configured to measure the flow of the product based on signals received from the sensor. The meter includes at least one supercapacitor electrically coupled with the microcomputer and configured to supply power to the microcomputer.

In accordance with another embodiment, a power meter includes a sensor configured to sense signals indicative of a power usage rate and a microcomputer communicatively coupled with the sensor and configured to receive the signals indicative of the power usage rate and calculate the power usage rate therefrom. The power meter includes at least one supercapacitor assembly electrically coupled with the microcomputer and configured to supply power to the microcomputer. The supercapacitor assembly includes an electrode assembly having a jelly-roll configuration.

In accordance with another embodiment, a smart power meter includes a sensor configured to sense signals indicative of a power usage rate and a microcomputer communicatively coupled with the sensor and configured to receive the signals indicative of the power usage rate and calculate the power usage rate therefrom. The supercapacitor module includes at least two supercapacitors electrically connected in series and a casing formed around the at least two supercapacitors. The supercapacitor module is electrically coupled with the microcomputer and configured to supply power to the microcomputer. A wireless communication unit is communicatively coupled with the microcomputer and configured to transmit the power usage rate.

Other features and aspects of the present disclosure are set forth in greater detail below.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figure in which.

Figure 1B:
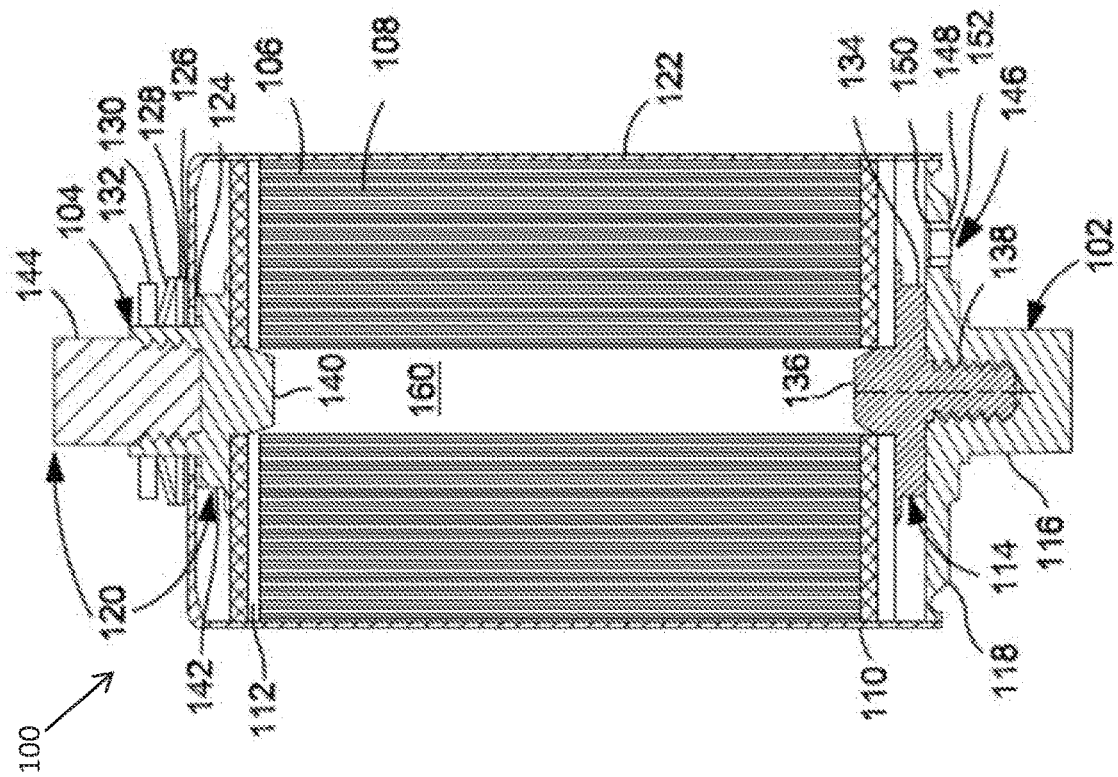
FIGS. 1A and 1B illustrate schematic views of one embodiment of a supercapacitor assembly in accordance with aspects of the present invention.

Repeat use of reference characters in the present specification and drawing is intended to represent same or analogous features or elements of the disclosure.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present disclosure, which broader aspects are embodied in the exemplary construction.

Aspects of the present disclosure are directed to a meter for measuring a flow of a product. The meter may include a sensor configured to sense the flow of the product and a microcomputer communicatively coupled with the sensor and configured to measure the flow of the product based on signals received from the sensor. The meter may include at least one supercapacitor electrically coupled with the microcomputer and configured to supply power to the microcomputer.

Regardless of the particular configuration employed, the present inventors have discovered that through selective control over the particular components of the supercapacitors (e.g., electrodes, ionic liquid, etc.) and the manner/conditions in which the supercapacitors are formed, a robust and reliable meter can be achieved. For example, according to aspects of the present disclosure, supercapacitor(s) may supply back-up power to the meter in the event of power outages and/or power glitches. For example, such meters may be able to continue transmitting information about power usage despite power glitches or abnormalities that may otherwise prevent the meter from properly functioning. Supercapacitors may also extend the life of batteries in the meter. For example, supercapacitor(s) may help meet irregular or excessive power demands by the power meter, which may reduce the load on the batteries in those situations.

According to aspects of the present disclosure, the particular components of the supercapacitors may be selected such that the supercapacitor exhibits excellent electrical properties. For example, the supercapacitor may exhibit a capacitance of about 6 Farads per cubic centimeter ("F/cm$^3$") or more, in some embodiments about 8 F/cm$^3$ or more, in some embodiments from about 9 to about 100 F/cm$^3$, and in some embodiments, from about 10 to about 80 F/cm$^3$, measured at a temperature of 23° C., frequency of 120 Hz, and without an applied voltage. The supercapacitor may also have a low equivalence series resistance (ESR), such as about 150 mohms or less, in some embodiments less than about 125 mohms, in some embodiments from about 0.01 to about 100 mohms, and in some embodiments, from about 0.05 to about 70 mohms, determined at a temperature of 23° C., frequency of 100 kHz, and without an applied voltage.

Supercapacitor Configuration

Any of a variety of different individual supercapacitors may generally be employed in the module of the present invention. Generally speaking, however, the supercapacitor may contain an electrode assembly and electrolyte contained and optionally hermetically sealed within a housing. The electrode assembly may, for instance, contain a first electrode that contains a first carbonaceous coating (e.g., activated carbon particles) electrically coupled to a first current collector, and a second electrode that contains a second carbonaceous coating (e.g., activated carbon particles) electrically coupled to a second current collector. It should be understood that additional current collectors may also be employed if desired, particularly if the supercapacitor includes multiple energy storage cells. The current collectors may be formed from the same or different materials. Regardless, each collector is typically formed from a substrate that includes a conductive metal, such as aluminum, stainless steel, nickel, silver, palladium, etc., as well as alloys thereof. Aluminum and aluminum alloys are particularly suitable for use in the present invention. The substrate may be in the form of a foil, sheet, plate, mesh, etc. The substrate may also have a relatively small thickness, such as about 200 micrometers or less, in some embodiments from about 1 to about 100 micrometers, in some embodiments from about 5 to about 80 micrometers, and in some embodiments, from about 10 to about 50 micrometers. Although by no means required, the surface of the substrate may be optionally roughened, such as by washing, etching, blasting, etc. The use of the term "about" in conjunction with a numerical value is intended to refer to within 20% of the stated amount.

First and second carbonaceous coatings may also be electrically coupled to the first and second current collectors, respectively. While they may be formed from the same or different types of materials and may contain one or multiple layers, each of the carbonaceous coatings generally contains at least one layer that includes activated particles. In certain embodiments, for instance, the activated carbon layer may be directly positioned over the current collector and may optionally be the only layer of the carbonaceous coating. Examples of suitable activated carbon particles may include, for instance, coconut shell-based activated carbon, petroleum coke-based activated carbon, pitch-based activated carbon, polyvinylidene chloride-based activated carbon, phenolic resin-based activated carbon, polyacrylonitrile-based activated carbon, and activated carbon from natural sources such as coal, charcoal or other natural organic sources.

In certain embodiments, it may be desired to selectively control certain aspects of the activated carbon particles, such as their particle size distribution, surface area, and pore size distribution to help improve ion mobility for certain types of electrolytes after being subjected to one or more charge-discharge cycles. For example, at least 50% by volume of the particles (D50 size) may have a size in the range of from about 0.01 to about 30 micrometers, in some embodiments from about 0.1 to about 20 micrometers, and in some embodiments, from about 0.5 to about 10 micrometers. At least 90% by volume of the particles (D90 size) may likewise have a size in the range of from about 2 to about 40 micrometers, in some embodiments from about 5 to about 30 micrometers, and in some embodiments, from about 6 to about 15 micrometers. The BET surface may also range from about 900 m$^2$/g to about 3,000 m$^2$/g, in some embodiments from about 1,000 m$^2$/g to about 2,500 m$^2$/g, and in some embodiments, from about 1,100 m$^2$/g to about 1,800 m$^2$/g.

In addition to having a certain size and surface area, the activated carbon particles may also contain pores having a certain size distribution. For example, the amount of pores less than about 2 nanometers in size (i.e., "micropores") may provide a pore volume of about 50 vol. % or less, in some embodiments about 30 vol. % or less, and in some embodiments, from 0.1 vol. % to 15 vol. % of the total pore volume. The amount of pores between about 2 nanometers and about 50 nanometers in size (i.e., "mesopores") may likewise be from about 20 vol. % to about 80 vol. %, in some embodiments from about 25 vol. % to about 75 vol. %, and in some embodiments, from about 35 vol. % to about 65 vol. %. Finally, the amount of pores greater than about 50 nanometers in size (i.e., "macropores") may be from about 1 vol. % to about 50 vol. %, in some embodiments from about 5 vol. % to about 40 vol. %, and in some embodiments, from about 10 vol. % to about 35 vol. %. The total pore volume of the carbon particles may be in the range of from about 0.2 cm$^3$/g to about 1.5 cm$^3$/g, and in some embodiments, from about 0.4 cm$^3$/g to about 1.0 cm$^3$/g, and the median pore width may be about 8 nanometers or less, in some embodiments from about 1 to about 5 nanometers, and in some embodiments, from about 2 to about 4 nanometers. The pore sizes and total pore volume may be measured using nitrogen adsorption and analyzed by the Barrett-Joyner-Halenda ("BJH") technique as is well known in the art.

If desired, binders may be present in an amount of about 60 parts or less, in some embodiments 40 parts or less, and in some embodiments, from about 1 to about 25 parts per 100 parts of carbon in the first and/or second carbonaceous coatings. Binders may, for example, constitute about 15 wt. % or less, in some embodiments about 10 wt. % or less, and in some embodiments, from about 0.5 wt. % to about 5 wt. % of the total weight of a carbonaceous coating. Any of a variety of suitable binders can be used in the electrodes. For instance, water-insoluble organic binders may be employed in certain embodiments, such as styrene-butadiene copolymers, polyvinyl acetate homopolymers, vinyl-acetate ethylene copolymers, vinyl-acetate acrylic copolymers, ethylene-vinyl chloride copolymers, ethylene-vinyl chloride-vinyl acetate terpolymers, acrylic polyvinyl chloride polymers, acrylic polymers, nitrile polymers, fluoropolymers such as polytetrafluoroethylene or polyvinylidene fluoride, polyolefins, etc., as well as mixtures thereof. Water-soluble organic binders may also be employed, such as polysaccharides and derivatives thereof. In one particular embodiment, the polysaccharide may be a nonionic cellulosic ether, such as alkyl cellulose ethers (e.g., methyl cellulose and ethyl cellulose);

hydroxyalkyl cellulose ethers (e.g., hydroxyethyl cellulose, hydroxypropyl cellulose, hydroxypropyl hydroxybutyl cellulose, hydroxyethyl hydroxypropyl cellulose, hydroxyethyl hydroxybutyl cellulose, hydroxyethyl hydroxypropyl hydroxybutyl cellulose, etc.); alkyl hydroxyalkyl cellulose ethers (e.g., methyl hydroxyethyl cellulose, methyl hydroxypropyl cellulose, ethyl hydroxyethyl cellulose, ethyl hydroxypropyl cellulose, methyl ethyl hydroxyethyl cellulose and methyl ethyl hydroxypropyl cellulose); carboxyalkyl cellulose ethers (e.g., carboxymethyl cellulose); and so forth, as well as protonated salts of any of the foregoing, such as sodium carboxymethyl cellulose.

Other materials may also be employed within an activated carbon layer of the first and/or second carbonaceous coatings and/or within other layers of the first and/or second carbonaceous coatings. For example, in certain embodiments, a conductivity promoter may be employed to further increase electrical conductivity. Exemplary conductivity promoters may include, for instance, carbon black, graphite (natural or artificial), graphite, carbon nanotubes, nanowires or nanotubes, metal fibers, graphenes, etc., as well as mixtures thereof. Carbon black is particularly suitable. When employed, conductivity promoters typically constitute about 60 parts or less, in some embodiments 40 parts or less, and in some embodiments, from about 1 to about 25 parts per 100 parts of the activated carbon particles in a carbonaceous coating. Conductivity promoters may, for example, constitute about 15 wt. % or less, in some embodiments about 10 wt. % or less, and in some embodiments, from about 0.5 wt. % to about 5 wt. % of the total weight of a carbonaceous coating. Activated carbon particles likewise typically constitute 85 wt. % or more, in some embodiments about 90 wt. % or more, and in some embodiments, from about 95 wt. % to about 99.5 wt. % of a carbonaceous coating.

The particular manner in which a carbonaceous coating is applied to a current collector may vary as is well known to those skilled in the art, such as printing (e.g., rotogravure), spraying, slot-die coating, drop-coating, dip-coating, etc. Regardless of the manner in which it is applied, the resulting electrode may typically be dried to remove moisture from the coating, such as at a temperature of about 100° C. or more, in some embodiments about 200° C. or more, and in some embodiments, from about 300° C. to about 500° C. The electrode may also be compressed (e.g., calendered) to optimize the volumetric efficiency of the supercapacitor. After any optional compression, the thickness of each carbonaceous coating may generally vary based on the desired electrical performance and operating range of the supercapacitor. Typically, however, the thickness of a coating may be from about 20 to about 200 micrometers, 30 to about 150 micrometers, and in some embodiments, from about 40 to about 100 micrometers. Coatings may be present on one or both sides of a current collector. Regardless, the thickness of the overall electrode (including the current collector and the carbonaceous coating(s) after optional compression) is typically within a range of from about 20 to about 350 micrometers, in some embodiments from about 30 to about 300 micrometers, and in some embodiments, from about 50 to about 250 micrometers.

The electrode assembly may also contain a separator that is positioned between the first and second electrodes. If desired, other separators may also be employed in the electrode assembly. For example, one or more separators may be positioned over the first electrode, the second electrode, or both. The separators enable electrical isolation of one electrode from another to help prevent an electrical short, but still allow transport of ions between the two electrodes. In certain embodiments, for example, a separator may be employed that includes a cellulosic fibrous material (e.g., airlaid paper web, wet-laid paper web, etc.), nonwoven fibrous material (e.g., polyolefin nonwoven webs), woven fabrics, film (e.g., polyolefin film), etc. Cellulosic fibrous materials are particularly suitable for use in the supercapacitor, such as those containing natural fibers, synthetic fibers, etc. Specific examples of suitable cellulosic fibers for use in the separator may include, for instance, hardwood pulp fibers, softwood pulp fibers, rayon fibers, regenerated cellulosic fibers, etc. Regardless of the particular materials employed, the separator typically has a thickness of from about 5 to about 150 micrometers, in some embodiments from about 10 to about 100 micrometers, and in some embodiments, from about 20 to about 80 micrometers.

The manner in which the components of the electrode assembly are combined together may vary as is known in the art. For example, the electrodes and separator may be initially folded, wound, or otherwise contacted together to form an electrode assembly. In one particular embodiment, the electrodes, separator, and optional electrolyte may be wound into an electrode assembly having a "jelly-roll" configuration. Referring to FIG. 1A, for instance, one embodiment of such a jellyroll electrode assembly 1100 is shown that contains a first electrode 1102, second electrode 1104, and a separator 1106 positioned between the electrodes 1102 and 1104. In this particular embodiment, the electrode assembly 1100 also includes another separator 1108 that is positioned over the second electrode 1104. In this manner, each of two coated surfaces of the electrodes is separated by a separator, thereby maximizing surface area per unit volume and capacitance. While by no means required, the electrodes 1102 and 1104 are offset in this embodiment so as to leave their respective contact edges extending beyond first and second edges of the first and second separators 1106 and 1108, respectively. Among other things, this can help prevent "shorting" due to the flow of electrical current between the electrodes.

To form a supercapacitor, an electrolyte may be placed into ionic contact with the first electrode and the second electrode before, during, and/or after the electrodes and separator are combined together to form the electrode assembly. The electrolyte may generally be nonaqueous in nature and thus contains at least one nonaqueous solvent. To help extend the operating temperature range of the supercapacitor, it is typically desired that the nonaqueous solvent have a relatively high boiling temperature, such as about 150° C. or more, in some embodiments about 200° C. or more, and in some embodiments, from about 220° C. to about 300° C. Particularly suitable high boiling point solvents may include, for instance, cyclic carbonate solvents, such as ethylene carbonate, propylene carbonate, butylene carbonate, vinylene carbonate, etc. Of course, other nonaqueous solvents may also be employed, either alone or in combination with a cyclic carbonate solvent. Examples of such solvents may include, for instance, open-chain carbonates (e.g., dimethyl carbonate, ethyl methyl carbonate, diethyl carbonate, etc.), aliphatic monocarboxylates (e.g., methyl acetate, methyl propionate, etc.), lactone solvents (e.g., butyrolactone valerolactone, etc.), nitriles (e.g., acetonitrile, glutaronitrile, adiponitrile, methoxyacetonitrile, 3-methoxypropionitrile, etc.), amides (e.g., N,N-dimethylformamide, N,N-diethylacetamide, N-methylpyrrolidinone), alkanes (e.g., nitromethane, nitroethane, etc.), sulfur compounds (e.g., sulfolane, dimethyl sulfoxide, etc.); and so forth.

The electrolyte may also contain at least one ionic liquid, which is dissolved in the nonaqueous solvent. While the concentration of the ionic liquid can vary, it is typically desired that the ionic liquid is present at a relatively high concentration. For example, the ionic liquid may be present in an amount of about 0.8 moles per liter (M) of the electrolyte or more, in some embodiments about 1.0 M or more, in some embodiments about 1.2 M or more, and in some embodiments, from about 1.3 to about 1.8 M.

The ionic liquid may generally be a salt having a relatively low melting temperature, such as about 400° C. or less, in some embodiments about 350° C. or less, in some embodiments from about 1° C. to about 100° C., and in some embodiments, from about 5° C. to about 50° C. The salt may contain a cationic species and counterion. The cationic species may contain a compound having at least one heteroatom (e.g., nitrogen or phosphorous) as a "cationic center." Examples of such heteroatomic compounds include, for instance, unsubstituted or substituted organoquaternary ammonium compounds, such as ammonium (e.g., trimethylammonium, tetraethylammonium, etc.), pyridinium, pyridazinium, pyramidinium, pyrazinium, imidazolium, pyrazolium, oxazolium, triazolium, thiazolium, quinolinium, piperidinium, pyrrolidinium, quaternary ammonium spiro compounds in which two or more rings are connected together by a spiro atom (e.g., carbon, heteroatom, etc.), quaternary ammonium fused ring structures (e.g., quinolinium, isoquinolinium, etc.), and so forth. In one particular embodiment, for example, the cationic species may be an N-spirobicyclic compound, such as symmetrical or asymmetrical N-spirobicyclic compounds having cyclic rings. One example of such a compound has the following structure:

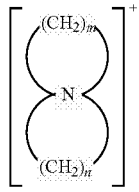

wherein m and n are independently a number from 3 to 7, and in some embodiments, from 4 to 5 (e.g., pyrrolidinium or piperidinium).

Suitable counterions for the cationic species may likewise include halogens (e.g., chloride, bromide, iodide, etc.); sulfates or sulfonates (e.g., methyl sulfate, ethyl sulfate, butyl sulfate, hexyl sulfate, octyl sulfate, hydrogen sulfate, methane sulfonate, dodecylbenzene sulfonate, dodecylsulfate, trifluoromethane sulfonate, heptadecafluorooctanesulfonate, sodium dodecylethoxysulfate, etc.); sulfosuccinates; amides (e.g., dicyanamide); imides (e.g., bis(pentafluoroethyl-sulfonyl)imide, bis(trifluoromethylsulfonyl)imide, bis(trifluoromethyl)imide, etc.); borates (e.g., tetrafluoroborate, tetracyanoborate, bis[oxalato]borate, bis[salicylato]borate, etc.); phosphates or phosphinates (e.g., hexafluorophosphate, diethylphosphate, bis(pentafluoroethyl)phosphinate, tris(pentafluoroethyl)-trifluorophosphate, tris(nonafluorobutyl)trifluorophosphate, etc.); antimonates (e.g., hexafluoroantimonate); aluminates (e.g., tetrachloroaluminate); fatty acid carboxylates (e.g., oleate, isostearate, pentadecafluorooctanoate, etc.); cyanates; acetates; and so forth, as well as combinations of any of the foregoing.

Several examples of suitable ionic liquids may include, for instance, spiro-(1,1')-bipyrrolidinium tetrafluoroborate, triethylmethyl ammonium tetrafluoroborate, tetraethyl ammonium tetrafluoroborate, spiro-(1,1')-bipyrrolidinium iodide, triethylmethyl ammonium iodide, tetraethyl ammonium iodide, methyltriethylammonium tetrafluoroborate, tetrabutylammonium tetrafluoroborate, tetraethylammonium hexafluorophosphate, etc.

As noted above, the supercapacitor may also contain a housing within which the electrode assembly and electrolyte are retained and optionally hermetically sealed. The nature of the housing may vary as desired. In one embodiment, for example, the housing may contain a metal container ("can"), such as those formed from tantalum, niobium, aluminum, nickel, hafnium, titanium, copper, silver, steel (e.g., stainless), alloys thereof, composites thereof (e.g., metal coated with electrically conductive oxide), and so forth. Aluminum is particularly suitable for use in the present invention. The metal container may have any of a variety of different shapes, such as cylindrical, D-shaped, etc. Cylindrically-shaped containers are particular suitable.

The electrode assembly may be sealed within the cylindrical housing using a variety of different techniques. The nature of the housing may vary as desired. In one embodiment, for example, the housing may contain a metal container ("can"), such as those formed from tantalum, niobium, aluminum, nickel, hafnium, titanium, copper, silver, steel (e.g., stainless), alloys thereof, composites thereof (e.g., metal coated with electrically conductive oxide), and so forth. Aluminum is particularly suitable. In other embodiments, the housing may include any suitable plastic material (e.g., polypropylene (PP), high-density polyethylene (HDPE), low-density polyethylene (LDPE), etc.). The container may have any of a variety of different shapes, such as cylindrical, D-shaped, etc. Cylindrically-shaped containers are particular suitable.

Figure 1A:
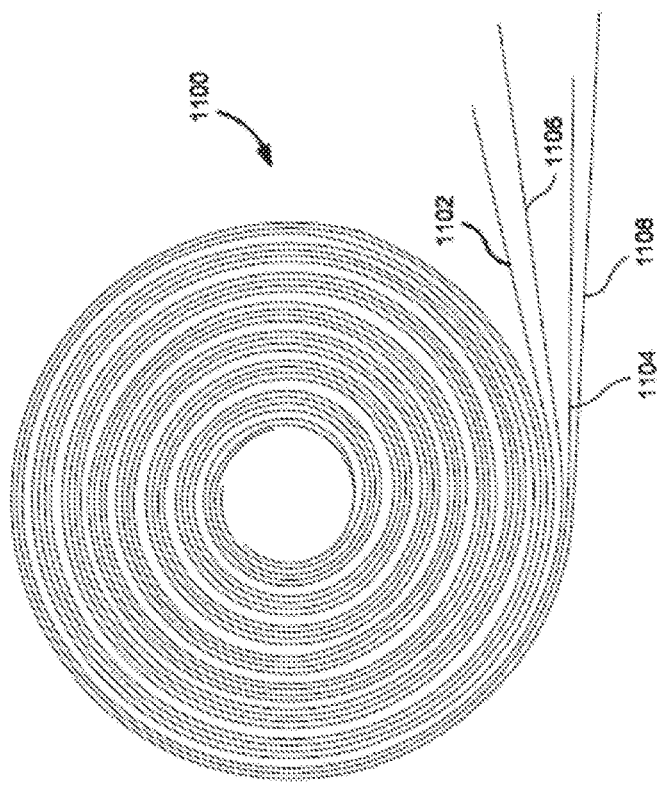

Referring to FIG. 1B, one embodiment of a supercapacitor assembly 100 is shown that contains an electrode assembly 108, which contains layers 106 wound together in a jellyroll configuration. In this particular embodiment, the supercapacitor contains a first collector disc 114, which contains a disc-shaped portion 134, a stud portion 136, and a fastener 138 (e.g., screw). The collector disc 114 may be aligned with a first end of a hollow core 160, which is formed in the center of the electrode assembly, and the stud portion 136 may then be inserted into an opening of the core so that the disc-shaped portion 134 sits against the first end of the electrode assembly 108 at a first contact edge 110. A lid 118 may be welded (e.g., laser welded) to a first terminal post 116, and a socket, which may be for example, threaded, may be coupled to the fastener 138. The supercapacitor may also contain a second collector disc 120, which may contain a disc-shaped portion 142, a stud portion 140, and a second terminal post 144. The second collector disc 120 may be aligned with the second end of the hollow core 160, and the stud portion 140 may then be inserted into the opening of the core so that the collector disc portion 142 sits against the second end of the electrode assembly 108.

A container 122 (e.g., cylindrically-shaped can) may thereafter be slid over the electrode assembly 108 so that the second collector disc 120 enters the container 122 first, passes through a first insulating washer 124, passes through an axial hole at an end of the container 122, and then passes through a second insulating washer 126. The second collector disc 120 also passes through a flat washer 128 and a spring washer 130. A locknut 132 may be tightened over the spring washer 130, which compresses the spring washer 130 against the flat washer 128, which in turn may be compressed against the second insulating washer 126. The second insulating washer 126 may be compressed against the exterior periphery of the axial hole in the metal container 122, and as the second collector disc 120 is drawn by this compressive force toward the axial hole, the first insulating washer 124 may be compressed between the second collector disc 120 and an interior periphery of the axial hole in the container 122. A flange on the first insulating washer 124 inhibits electrical contact between the second collector disc 120 and a rim of the axial hole. Simultaneously, the lid 118 may be drawn into an opening of the container 122 so that a rim of the lid 118 sits just inside a lip of the opening of the container 122. The rim of the lid 118 may be then welded to the lip of the opening of the container 122.

Once the locknut 132 is tightened against the spring washer 130, a hermetic seal may be formed between the axial hole, the first insulating washer 124, the second insulating washer 126, and the second collector disc 120. Similarly, the welding of the lid 118 to the lip of the container 122, and the welding of the lid 118 to the first terminal post 116, may form another hermetic seal. A hole 146 in the lid 118 can remain open to serve as a fill port for the electrolyte described above. Once the electrolyte is in the can (i.e., drawn into the can under vacuum, as described above), a bushing 148 may be inserted into the hole 146 and seated against a flange 150 at an interior edge of the hole 146. The bushing 148 may, for instance, be a hollow cylinder in shape, fashioned to receive a plug 152. The plug 152, which is cylindrical in shape, may be pressed into a center of the bushing 148, thereby compressing the bushing 148 against an interior of the hole 146 and forming a hermetic seal between the hole 146, the bushing 148, and the plug 152. The plug 152 and the bushing 148 may be selected to dislodge when a prescribed level of pressure is reached within the supercapacitor, thereby forming an overpressure safety mechanism.

The embodiments described above generally refer to the use of a single electrochemical cell in the capacitor. It should of course be understood, however, that the capacitor of the present invention may also contain two or more electrochemical cells. In one such embodiment, for example, the capacitor may include a stack of two or more electrochemical cells, which may be the same or different.

The resulting supercapacitor can exhibit excellent electrical properties. For example, the supercapacitor may exhibit a capacitance of about 6 Farads per cubic centimeter ("$F/cm^3$") or more, in some embodiments about 8 $F/cm^3$ or more, in some embodiments from about 9 to about 100 $F/cm^3$, and in some embodiments, from about 10 to about 80 $F/cm^3$, measured at a temperature of 23° C., frequency of 120 Hz, and without an applied voltage. The supercapacitor may also have a low equivalence series resistance (ESR), such as about 150 mohms or less, in some embodiments less than about 125 mohms, in some embodiments from about 0.01 to about 100 mohms, and in some embodiments, from about 0.05 to about 70 mohms, determined at a temperature of 23° C., frequency of 100 kHz, and without an applied voltage.

Notably, the supercapacitor may also exhibit excellent electrical properties even when exposed to high temperatures. For example, the supercapacitor may be placed into contact with an atmosphere having a temperature of from about 80° C. or more, in some embodiments from about 100° C. to about 150° C., and in some embodiments, from about 105° C. to about 130° C. (e.g., 85° C. or 105° C.). The capacitance and ESR values can remain stable at such temperatures for a substantial period of time, such as for about 100 hours or more, in some embodiments from about 300 hours to about 5000 hours, and in some embodiments, from about 600 hours to about 4500 hours (e.g., 168, 336, 504, 672, 840, 1008, 1512, 2040, 3024, or 4032 hours).

In one embodiment, for example, the ratio of the capacitance value of the supercapacitor after being exposed to the hot atmosphere (e.g., 85° C. or 105° C.) for 1008 hours to the capacitance value of the supercapacitor when initially exposed to the hot atmosphere may be about 0.75 or more, in some embodiments from about 0.8 to 1.0, and in some embodiments, from about 0.85 to 1.0. Such high capacitance values can also be maintained under various extreme conditions, such as when applied with a voltage and/or in a humid atmosphere. For example, the ratio of the capacitance value of the supercapacitor after being exposed to the hot atmosphere (e.g., 85° C. or 105° C.) and an applied voltage to the initial capacitance value of the supercapacitor when exposed to the hot atmosphere but prior to being applied with the voltage may be about 0.60 or more, in some embodiments from about 0.65 to 1.0, and in some embodiments, from about 0.7 to 1.0. The voltage may, for instance, be about 1 volt or more, in some embodiments about 1.5 volts or more, and in some embodiments, from about 2 to about 10 volts (e.g., 2.1 volts). In one embodiment, for example, the ratio noted above may be maintained for 1008 hours or more. The supercapacitor may also maintain the capacitance values noted above when exposed to high humidity levels, such as when placed into contact with an atmosphere having a relative humidity of about 40% or more, in some embodiments about 45% or more, in some embodiments about 50% or more, and in some embodiments, about 70% or more (e.g., about 85% to 100%). Relative humidity may, for instance, be determined in accordance with ASTM E337-02, Method A (2007). For example, the ratio of the capacitance value of the supercapacitor after being exposed to the hot atmosphere (e.g., 85° C. or 105° C.) and high humidity (e.g., 85%) to the initial capacitance value of the supercapacitor when exposed to the hot atmosphere but prior to being exposed to the high humidity may be about 0.7 or more, in some embodiments from about 0.75 to 1.0, and in some embodiments, from about 0.80 to 1.0. In one embodiment, for example, this ratio may be maintained for 1008 hours or more.

The ESR can also remain stable at such temperatures for a substantial period of time, such as noted above. In one embodiment, for example, the ratio of the ESR of the supercapacitor after being exposed to the hot atmosphere (e.g., 85° C. or 105° C.) for 1008 hours to the ESR of the supercapacitor when initially exposed to the hot atmosphere may be about 1.5 or less, in some embodiments about 1.2 or less, and in some embodiments, from about 0.2 to about 1. Notably, such low ESR values can also be maintained under various extreme conditions, such as when applied with a high voltage and/or in a humid atmosphere as described above. For example, the ratio of the ESR of the supercapacitor after being exposed to the hot atmosphere (e.g., 85° C. or 105° C.) and an applied voltage to the initial ESR of the supercapacitor when exposed to the hot atmosphere but prior to being applied with the voltage may be about 1.8 or less, in some embodiments about 1.7 or less, and in some embodiments, from about 0.2 to about 1.6. In one embodiment, for example, the ratio noted above may be maintained for 1008 hours or more. The supercapacitor may also maintain the ESR values noted above when exposed to high humidity levels. For example, the ratio of the ESR of the supercapacitor after being exposed to the hot atmosphere (e.g., 85° C. or 105° C.) and high humidity (e.g., 85%) to the initial capacitance value of the supercapacitor when exposed to the hot atmosphere but prior to being exposed to the high humidity may be about 1.5 or less, in some embodiments about 1.4 or less, and in some embodiments, from about 0.2 to about 1.2. In one embodiment, for example, this ratio may be maintained for 1008 hours or more.

In some embodiments, the supercapacitor may have a capacitance ranging from about 1 F to about 1,500 F, in some embodiments from about 100 F to about 1,000 F. In some embodiments, the supercapacitor may have an operating voltage ranging from about 2 V to about 4 V, such as about 2.7 V.

The supercapacitor may be any suitable size and shape. For example, in some embodiments, the container of the supercapacitor may have a length ranging from about 10 mm to about 250 mm, in some embodiments from about 20 mm to about 120 mm. In some embodiments, the container of the supercapacitor may have a generally cylindrical shape, and a diameter ranging from about 3 mm to about 70 mm, and in some embodiments from about 8 mm to about 40 mm.

Casing

In some embodiments, a casing (e.g., an encapsulant layer) may be formed over the housing of the supercapacitor assembly, for example from a thermoset resin. Examples of such resins include, for instance, epoxy resins, polyimide resins, melamine resins, urea-formaldehyde resins, polyurethane resins, phenolic resins, polyester resins, etc. Epoxy resins are also particularly suitable for use in the encapsulant layer. Examples of suitable epoxy resins include, for instance, glycidyl ether type epoxy resins, such as bisphenol A type epoxy resins, bisphenol F type epoxy resins, phenol novolac type epoxy resins, orthocresol novolac type epoxy resins, brominated epoxy resins and biphenyl type epoxy resins, cyclic aliphatic epoxy resins, glycidyl ester type epoxy resins, glycidylamine type epoxy resins, cresol novolac type epoxy resins, naphthalene type epoxy resins, phenol aralkyl type epoxy resins, cyclopentadiene type epoxy resins, heterocyclic epoxy resins, etc.

If desired, curing agents may also be employed in the encapsulant layer to help promote curing. When employed, the curing agents typically constitute from about 0.1 to about 20 wt. % of the encapsulant layer. Exemplary curing agents include, for instance, amines, peroxides, anhydrides, phenol compounds, silanes, acid anhydride compounds and combinations thereof. Specific examples of suitable curing agents are dicyandiamide, 1-(2 cyanoethyl) 2-ethyl-4-methylimidazole, 1-benzyl 2-methylimidazole, ethyl cyano propyl imidazole, 2-methylimidazole, 2-phenylimidazole, 2-ethyl-4-methylimidazole, 2-undecylimidazole, 1-cyanoethyl-2-methylimidazole, 2,4-dicyano-6,2-methylimidazolyl-(1)-ethyl-s-triazine, and 2,4-dicyano-6,2-undecylimidazolyl-(1)-ethyl-s-triazine, imidazolium salts (such as 1-cyanoethyl-2-undecylimidazolium trimellitate, 2-methylimidazolium isocyanurate, 2-ethyl-4-methylimidazolium tetraphenylborate, and 2-ethyl-1,4-dimethylimidazolium tetraphenylborate, etc. Still other useful curing agents include phosphine compounds, such as tributylphosphine, triphenylphosphine, tris(dimethoxyphenyl)phosphine, tris(hydroxypropyl)phosphine, and tris(cyanoethyl)phsphine; phosphonium salts, such as tetraphenylphosphonium-tetraphenylborate, methyltributylphosphonium-tetraphenylborate, and methyltricyanoethylphosphonium tetraphenylborate); amines, such as 2,4,6-tris(dimethylaminomethyl) phenol, benzylmethylamine, tetramethylbutylguanidine, N-methylpiperazine, and 2-dimethylamino-1-pyrroline; ammonium salts, such as triethylammonium tetraphenylborate; diazabicyclo compounds, such as 1,5-diazabicyclo[5,4,0]-7-undecene, 1,5-diazabicyclo[4,3,0]-5-nonene, and 1,4-diazabicyclo[2,2,2]-octane; salts of diazabicyclo compounds such as tetraphenylborate, phenol salt, phenolnovolac salt, and 2-ethylhexanoic acid salt; and so forth.

Still other additives may also be employed, such as photoinitiators, viscosity modifiers, suspension aiding agents, pigments, stress reducing agents, non-conductive fillers, stabilizers, etc. Suitable photoinitiators may include, for instance, benzoin, benzoin methyl ether, benzoin ethyl ether, benzoin n-propyl ether, benzoin isobutyl ether, 2,2 dihydroxy-2-phenylacetophenone, 2,2-dimethoxy-2-phenylacetophenone 2,2-diethoxy-2-phenylacetophenone, 2,2-diethoxyacetophenone, benzophenone, 4,4-bisdialylaminobenzophenone, 4-dimethylaminobenzoic acid, alkyl 4-dimethylaminobenzoate, 2-ethylanthraquinone, xanthone, thioxanthone, 2-cholorothioxanthone, etc. Likewise, the non-conductive fillers may include inorganic oxide particles, such as silica, alumina, zirconia, magnesium oxide, iron oxide, copper oxide, zeolites, silicates, clays (e.g., smectite clay), etc., as well as composites (e.g., alumina-coated silica particles) and mixtures thereof. In certain embodiments, fillers that contain a silicon atom, such as silica and/or silicates, may be particularly suitable to enhance the ability of the barrier layer to bond to the encapsulant layer, such as through a silicon-oxygen bond. When employed, such fillers may, for instance, constitute from about 20 wt. % to about 95 wt. %, and in some embodiments, from about 50 wt. % to about 85 wt. % of the encapsulant layer.

Meter

Aspects of the present disclosure are directed to a meter for measuring a flow of a product, (e.g., electricity, water, gas, etc.). For example, power meters may be configured to measure power usage (e.g., of residential and/or commercial buildings). Some power meters (e.g., "smart" power meters) may be capable of wirelessly communicating data about the measured power consumption for improved monitoring and/or management of the power grid. For example, smart power meters may communicate power usage to a utility station and/or personal computing device. This may allow residents to monitor the power usage of their house or apartment, which may result in more efficient power use and management.

Power Meters

Figure 2A:
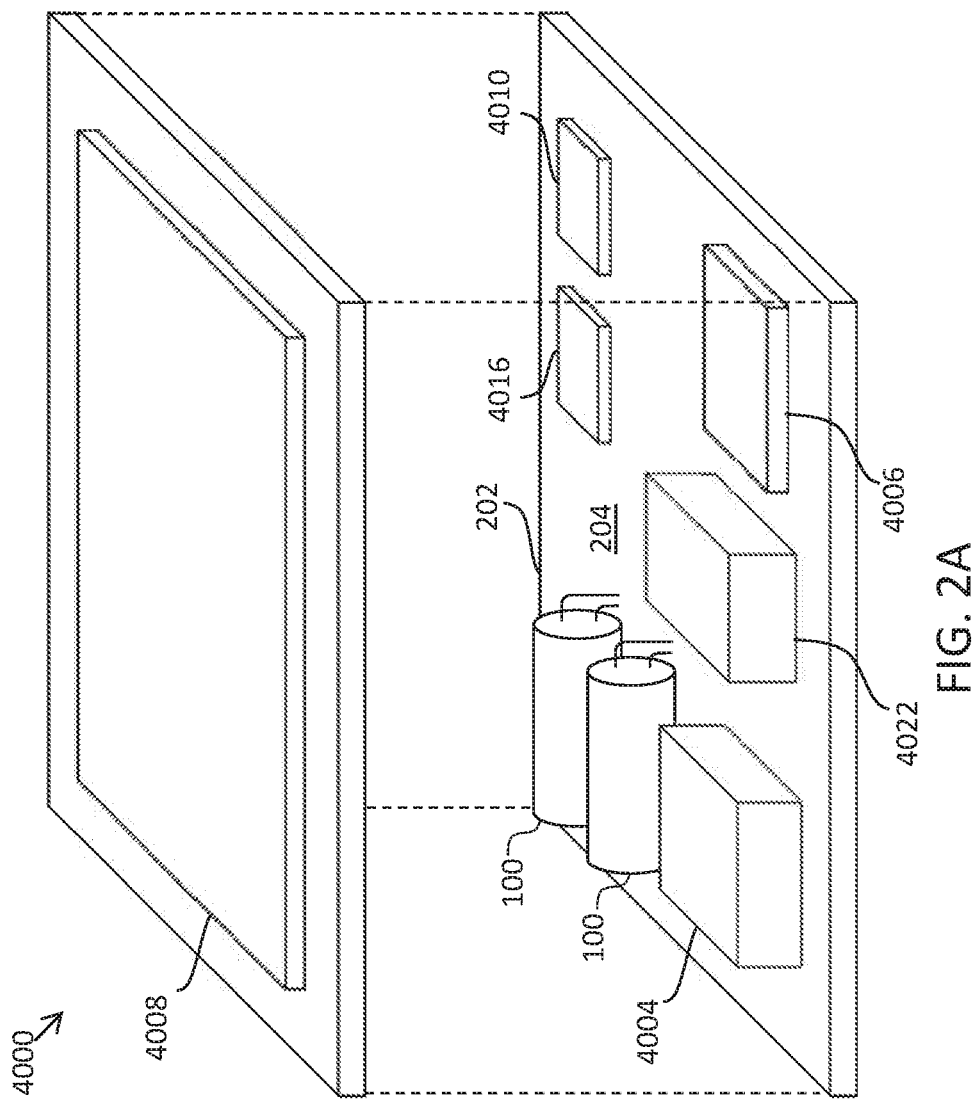
FIG. 2A illustrates a perspective view of an embodiment of a meter for measuring power usage that includes a supercapacitor assembly in accordance with aspects of the present disclosure.
Figure 2B:
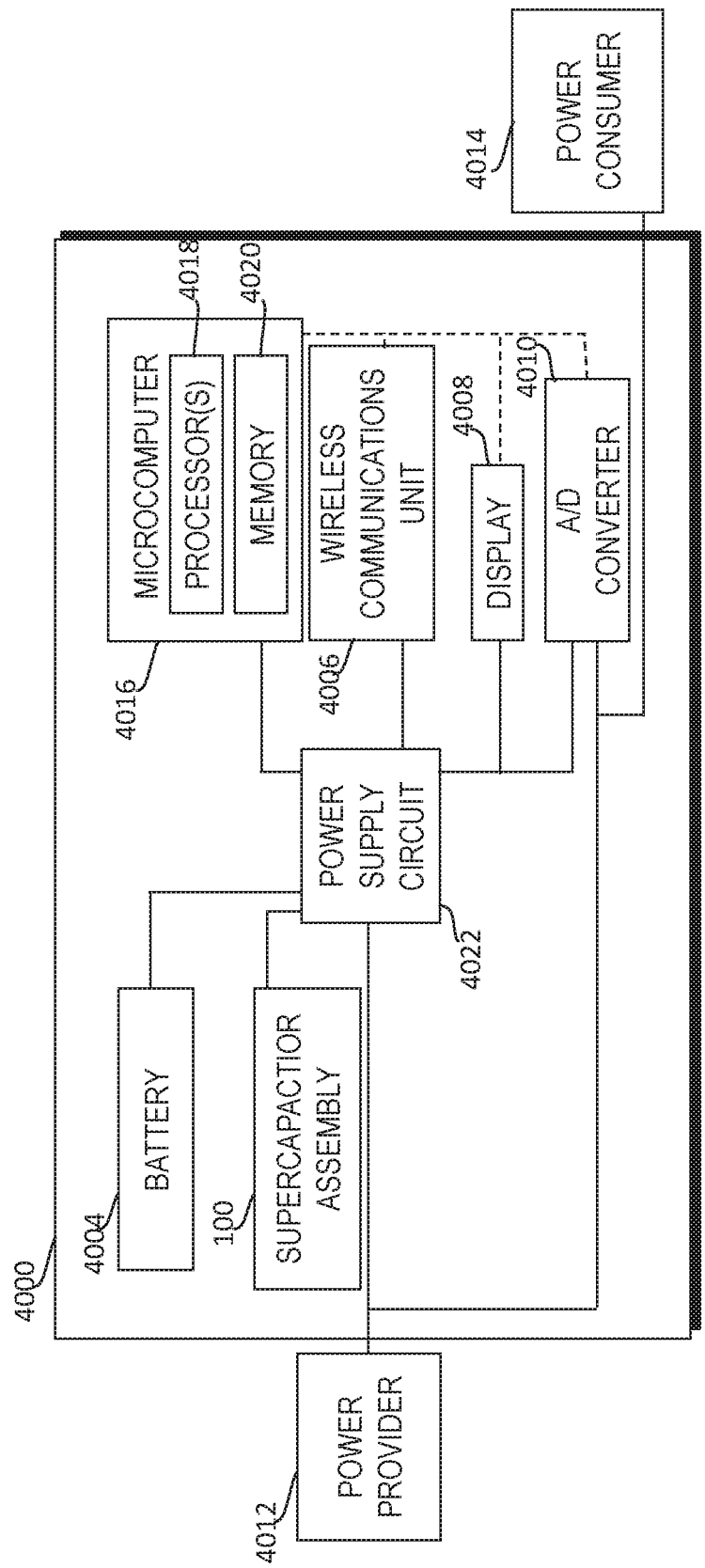
FIG. 2B illustrates a schematic view of an embodiment of a meter for measuring power usage that includes a supercapacitor assembly in accordance with aspects of the present disclosure.

Referring to FIGS. 2A and 2B, in some embodiments, a meter may be configured as a power meter 4000 and include at least one the supercapacitor assembly 100 mounted to a substrate 202, such as a PCB. In some embodiments, the power meter 4000 may also include a battery 4004 that is electrically connected with the supercapacitor assemblies 100. The supercapacitor assemblies 100 may be configured to provide a backup power supply in the event of excessive power demand or battery failure, as discussed above.

The power meter 4000 may be configured as a "smart" power meter and include a wireless communication unit 4006 that is configured to transmit and/or receive data via any suitable network, such as a local wireless network using any suitable wireless communications protocol (e.g., WiFi, Bluetooth, and/or the like) and/or a broader network, such as a wide-area network (WAN), using any suitable communications protocol (e.g., TCP/IP, HTTP, SMTP, FTP). The power meter 4000 may be configured to transmit power usage to a utility provider and/or a user computing device for monitoring.

The power meter 4000 may also include a display 4008 and/or user input device. For example, the display 4008 may be configured as a touchscreen such that a user may input information (e.g., settings, alerts, etc.) using the touchscreen.

The power meter 4000 may include a sensor 4010 configured to measure a power usage rate. For example, in some embodiments, the sensor 4010 may include an A/D converter configured to detect an analog signal (e.g., voltage or current) indicative of a measurement of the power flowing through the power meter 4000. For example, the A/D converter 4010 may be electrically connected with each of a power provider 4012 (e.g., a power grid supplied by a power station) and a power consumer 4014 (e.g., a residential and/or commercial building). The A/D converter 4010 may convert the analog signal into a digital signal indicative of the power usage rate.

The power meter 4000 may also include a microcomputer 4016. In general, the microcomputer 4016 may correspond to any suitable processor-based device(s), such as a computing device or any combination of computing devices. Thus, in several embodiments, the microcomputer 4016 may include one or more processor(s) 4018 and associated memory device(s) 4020 configured to perform a variety of computer-implemented functions. As used herein, the term "processor" refers not only to integrated circuits referred to in the art as being included in a computer, but also refers to a programmable logic controller (PLC), an application specific integrated circuit, and other programmable circuits. Additionally, the memory device(s) may generally comprise memory element(s) including, but not limited to, computer readable medium (e.g., random access memory (RAM)), computer readable non-volatile medium (e.g., a flash memory), a compact disc-read only memory (CD-ROM), a magneto-optical disk (MOD), a digital versatile disc (DVD) and/or other suitable memory elements. Such memory device(s) may generally be configured to store suitable computer-readable instructions that, when implemented by the processor(s) configure the controller to perform various computer-implemented functions.

The microcomputer 4016 may be communicatively coupled with the wireless communications unit 4006, display 4008, and/or sensor 4010. The microcomputer 4016 may be configured to receive signals from the sensor 4010 indicative of the power usage rate and calculate the power usage rate based on the received signals. The microcomputer 4016 may also be configured to transmit the power usage rate via the wireless communications unit 4006 and/or control the operation of the display 4008 such that the power usage rate may appear on the display 4008.

The smart meter 4000 may also include a power supply circuit 4022. The power supply circuit 4022 may be electrically connected with the supercapacitor assemblies 100, the battery 4004, and/or the power provider 4012. For example, the power supply circuit 4005 may be configured to regulate power supplied from at least one supercapacitor assembly 100, the battery 4004, and/or the power provider 4012 to the microcomputer 4012, wireless communication unit 4006, display 4008, and/or sensor 4010. For example, if the power supplied by the power provider 4012 becomes intermitted and/or irregular, the power supply circuit 4022 may draw power from the battery and/or supercapacitor assembly 100 to meet the demands of the other components included in the smart meter 4000.

The smart power meter 4000 may be configured to as an "Internet of Things" ("IoT") device. The microcomputer 4016 may be configured to perform other various functions. For example, the microcomputer 4016 may be configured to detect when the power usage rate exceeds a predetermined threshold and transmit an alert (via the wireless communications unit 4006). In some embodiments, the microcomputer 4016 may also be configured to wireless communicate (via the wireless communications unit 4006) with individual power-consuming devices, such as smart appliances, for example. The microcomputer 4016 may be configured to monitor the power used by such appliances with respect to the total power usage rate detected by the A/D converter 4010. For example, the microcomputer 4016 may be configured to compile a summary showing the total power used in a given time period (e.g., one month) and the portions thereof used by individual power-consuming devices (e.g., smart appliances). The microcomputer 4016 may be configured to transmit the summary via the wireless communications unit 4006 to the resident of the house, for example.

Water and Gas Meters

In other embodiments, the meter may be configured as a water or gas meter. In such embodiments, the sensor 4010 may be a flow transducer and be configured to generate signals indicative of the flow rate of water or gas from a source to a consumer unit (e.g., a residential or commercial building). In such embodiments, battery 4004 and/or supercapacitor assembly 100 may be the sole supply of power for the meter. Thus, the power supply circuit 4022 may be configured to regulate the power supplied from the battery 4004 and supercapacitor assembly 100 to the other components of the meter. In the event of battery failure, the supercapacitor assembly 100 may provide power for an additional time period such that the meter may send a signal via the wireless communications unit 4006 indicating that the battery 4004 has failed and that servicing is needed.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A meter for measuring a flow of a product, the meter comprising:
   a sensor configured to sense the flow of the product;
   a microcomputer communicatively coupled with the sensor and configured to measure the flow of the product based on signals received from the sensor;
   at least one supercapacitor electrically coupled with the microcomputer and configured to supply power to the microcomputer wherein the at least one supercapacitor exhibits a capacitance of about 6 Farads per cubic centimeter or more; and
   a power supply circuit electrically connected with the at least one supercapacitor, the power supply circuit configured to regulate power supplied to the microcomputer by the at least one supercapacitor.

2. The meter of claim 1, wherein the product is electricity.

3. The meter of claim 1, wherein the product is water.

4. The meter of claim 1, wherein the product is gas.

5. The meter of claim 1, further comprising a wireless communication unit communicatively coupled with the microcomputer.

6. The meter of claim 1, further comprising a battery, and wherein the power supply circuit is electrically connected with the battery and configured to regulate power supplied to the microcomputer by the battery.

7. The meter of claim 1, wherein the sensor comprises an analog-digital converter electrically connected with a power supply line.

8. The meter of claim 1, wherein the at least one supercapacitor comprises an electrode assembly having a jelly-roll configuration.

9. The meter of claim 1, wherein the at least one supercapacitor comprises:
a first current collector;
a first electrode that contains a first carbonaceous coating electrically coupled to the first current collector;
a second current collector; and
a second carbonaceous coating electrically coupled to the second current collector.

10. The meter of claim 1, wherein the at least one supercapacitor exhibits a capacitance of about 8 Farads per cubic centimeter or more.

11. The meter of claim 1, wherein the at least one supercapacitor has an equivalent series resistance of about 150 mohms or less.

12. The meter of claim 1, further comprising a casing formed around the at least one supercapacitor, the casing comprising a resin.

13. A power meter comprising:
a sensor configured to sense signals indicative of a power usage rate;
a microcomputer communicatively coupled with the sensor and configured to receive the signals indicative of the power usage rate and calculate the power usage rate therefrom;
at least one supercapacitor assembly electrically coupled with the microcomputer and configured to supply power to the microcomputer;
wherein the at least one supercapacitor assembly comprises an electrode assembly having a jelly-roll configuration and wherein the at least one supercapacitor assembly includes at least one supercapacitor that exhibits a capacitance of about 6 Farads per cubic centimeter or more; and
a power supply circuit electrically connected with the at least one supercapacitor, the power supply circuit configured to regulate power supplied to the microcomputer by the at least one supercapacitor.

14. The power meter of claim 13, further comprising a wireless communication unit communicatively coupled with the microcomputer and configured to transmit the power usage rate.

15. The power meter of claim 14, further comprising a power supply circuit electrically connected with the at least one supercapacitor, the power supply circuit configured to regulate power supplied to the microcomputer by the at least one supercapacitor.

16. The power meter of claim 15, further comprising a battery, and wherein the power supply circuit is electrically connected with the battery and configured to regulate power supplied to the microcomputer by the battery.

17. The power meter of claim 16, wherein the sensor comprises an analog-digital converter electrically connected with a power supply line.

18. A smart power meter comprising:
a sensor configured to sense signals indicative of a power usage rate;
a microcomputer communicatively coupled with the sensor and configured to receive the signals indicative of the power usage rate and calculate the power usage rate therefrom;
a supercapacitor module comprising at least two supercapacitors electrically connected in series and a casing formed around the at least two supercapacitors, the supercapacitor module electrically coupled with the microcomputer and configured to supply power to the microcomputer;
a wireless communication unit communicatively coupled with the microcomputer and configured to transmit the power usage rate; and
a power supply circuit electrically connected with the at least one supercapacitor, the power supply circuit configured to regulate power supplied to the microcomputer by the at least one supercapacitor.

* * * * *